United States Patent
Rasmussen et al.

(10) Patent No.: US 8,607,111 B2
(45) Date of Patent: Dec. 10, 2013

(54) SUB-INSTRUCTION REPEATS FOR ALGORITHMIC PATTERN GENERATORS

(75) Inventors: Phillip Rasmussen, Boise, ID (US); Charles Snodgrass, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1496 days.

(21) Appl. No.: 11/513,087

(22) Filed: Aug. 30, 2006

(65) Prior Publication Data

US 2008/0082886 A1    Apr. 3, 2008

(51) Int. Cl.
  *G01R 31/28*    (2006.01)
  *G06F 11/00*    (2006.01)
(52) U.S. Cl.
  USPC .......................................... 714/738; 714/744
(58) Field of Classification Search
  USPC ......................................................... 714/738
  See application file for complete search history.

(56) References Cited

U.S. PATENT DOCUMENTS

| | | | |
|---|---|---|---|
| 4,905,183 A * | 2/1990 | Kawaguchi et al. | 712/19 |
| 5,127,010 A * | 6/1992 | Satoh | 714/739 |
| 5,787,097 A | 7/1998 | Roohparvar et al. | |
| 5,825,782 A | 10/1998 | Roohparvar | |
| 5,929,647 A | 7/1999 | Akram et al. | |
| 5,935,263 A | 8/1999 | Keeth et al. | |
| 6,006,349 A * | 12/1999 | Fujisaki | 714/738 |
| 6,014,759 A | 1/2000 | Manning | |
| 6,032,274 A | 2/2000 | Manning | |
| 6,158,030 A | 12/2000 | Reichle et al. | |
| 6,169,695 B1 | 1/2001 | Duesman | |
| 6,181,616 B1 | 1/2001 | Byrd | |
| 6,192,495 B1 | 2/2001 | Totorica et al. | |
| 6,243,797 B1 | 6/2001 | Merritt | |
| 6,275,058 B1 | 8/2001 | Lunde et al. | |
| 6,321,356 B1 | 11/2001 | Snodgrass et al. | |
| 6,349,399 B1 | 2/2002 | Manning | |
| 6,400,625 B2 * | 6/2002 | Arimoto et al. | 365/201 |
| 6,418,070 B1 | 7/2002 | Harrington et al. | |
| 6,633,014 B2 | 10/2003 | Casper | |
| 6,785,162 B2 | 8/2004 | Naso et al. | |
| 6,968,448 B2 | 11/2005 | Snodgrass et al. | |

* cited by examiner

*Primary Examiner* — Steve Nguyen
(74) *Attorney, Agent, or Firm* — Leffert Jay & Polglaze, P.A.

(57) ABSTRACT

An integrated circuit tester is described that utilizes methods of programming parallel coupled Algorithmic Pattern Generators (APGs) to generate test vector sequences and part commands with sub-instruction repeats. This enables simpler test programming and ease of test conversion to new part speed grades, steppings, or part designs. In one embodiment, a sub-instruction repeat is utilized to enable adjustment of the timing of test vector sequences and part commands sent to an integrated circuit device under test (DUT) so that the test can be adjusted for new part speed grades and/or steppings. In another embodiment, a sub-instruction repeats are utilized to enable adjustment of the timing of a memory device inputs, memory commands and test vector sequences so that the test can be adjusted for new memory device speed grades.

42 Claims, 3 Drawing Sheets n-number of instruction bits
m-number of bits for repeat count

SUB-INSTRUCTION REPEATS FOR ALGORITHMIC PATTERN GENERATORS

TECHNICAL FIELD OF THE INVENTION

Embodiments of the present invention relate generally to testing integrated circuits and in particular the present invention relates to algorithmic pattern generators.

BACKGROUND OF THE INVENTION

Integrated circuits are conventionally provided as internal functional components of modern electronics and computer devices. The term integrated circuit identifies circuits that come in the form of integrated circuit chips. One form of integrated circuits are data storage devices, known as memory devices, which are conventionally utilized as internal storage areas in computers and computer based devices. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM (read-only memory), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Memory devices that do not lose the data content of their memory cells when power is removed are generally referred to as non-volatile memories. EEPROM (electrically erasable programmable read-only memory) and Flash memory are special types of non-volatile ROM that can be erased by exposing their cells to an electrical charge. EEPROM and Flash comprise a large number of memory cells having electrically isolated gates (floating gates). Data is stored in the floating gate field effect transistor (FET) memory cells in the form of charge on the floating gates.

Memory devices and other integrated circuits are conventionally tested as part of the manufacturing process to ensure proper operation. This is conventionally done at the end of the manufacturing process by an integrated circuit tester before the integrated circuit chip die is packaged in its final form. To reduce the number of test "vectors" having to be pre-generated and stored for application to the part during testing, integrated circuit testers conventionally utilize algorithmic test pattern generators (APGs), to generate the vectors on the fly from programmed test instructions. A problem in testing modern integrated circuits and memory devices is that, as device sizes and features are further reduced with improved processing and the speed, complexity, and density of the resulting integrated circuits increased, the resources of the integrated circuit tester are increasingly taxed and the time required for testing the integrated circuits is generally increased. As a result, many testers utilize two or more APGs in a parallel manner to increase throughput and speed. In addition, the testing patterns and processes utilized by the integrated circuit tester have also increased in complexity, increasing the time required to develop new test patterns and reducing the ability to reuse portions of old patterns in new designs, particularly in integrated circuit tester implementations that require test code designed for parallel APG usage.

For the reasons stated above, and for other reasons stated below which will become apparent to those skilled in the art upon reading and understanding the present specification, there is a need in the art for alternative methods of testing integrated circuits and generating integrated circuit testing patterns.

DETAILED DESCRIPTION

Figure 1:
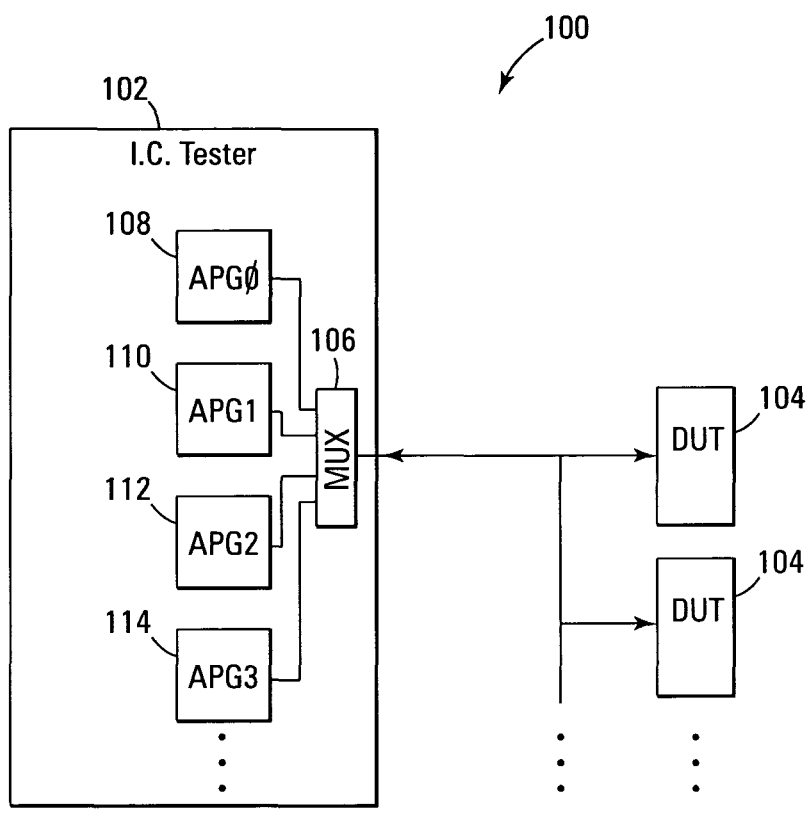
FIG. 1 is a simplified block diagram of an integrated circuit tester in accordance with an embodiment of the present invention.

In the following detailed description of the present embodiments, reference is made to the accompanying drawings that form a part hereof, and in which is shown by way of illustration specific present embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Embodiments of the present invention include integrated circuit testers that utilize simplified methods of programming parallel coupled Algorithmic Pattern Generators (APGs) to generate test vectors and part commands with sub-instruction repeats. This enables simpler test programming and ease of test conversion to new part speed grades, steppings, or part designs. In one embodiment, a sub-instruction repeat is utilized to enable adjustment of the timing of test vector inputs and commands to an integrated circuit device under test (DUT) so that the test can be adjusted for new part speed grades and/or steppings. In another embodiment, a sub-instruction repeats are utilized to enable adjustment of the timing of a memory test vector inputs and part commands so that the test can be adjusted for new memory device speed grades.

In testing an integrated circuit, a tester generates a huge number of test "vectors" to apply to the device under test (DUT). These vectors are designed to exercise the internal circuits and/or state machines/processors of the DUT and determine if there are any faults. These faults can include, but are not limited to, shorts, opens, stuck-at, cross coupling, logic faults, or state machine/processor errors. In addition, speed rating, signal timings, and operating voltage tolerances may also be tested. Each test vector is typically designed to test a particular piece of circuitry of the DUT and can comprise a sequence of one or more part commands and signals. The test run by the integrated circuit tester is designed in such a way to test the whole of the integrated circuit/DUT (or as much of the circuit that is externally visible and logically available for testing) with as small a number of test vectors as possible. This enables the overall testing process to short and efficient, decreasing manufacturing time and overhead. However, as the number and sequencing of test vectors required to test modern integrated circuits and memory devices can be quite large and complex, integrated circuit testers typically do not store the test vectors directly. Instead, the vectors are programmatically described and are then generated as needed, on the fly, by Algorithmic Pattern Generators (APGs).

The Algorithmic Pattern Generators (APGs) that are utilized to generate these test patterns or "vectors" have similar characteristics to processors and, as such, must read and interpret a sequence of program opcodes that comprise the test code (or "test") to generate the vectors. In addition, like a processor, APGs typically run slower than a comparable hard-wired hardware implementation. To compensate for this, most testers run two or more APG's in parallel to generate the vectors at the speed required to test the device at its specified speed rating and timings. This makes programming of the APGs quite difficult, error prone, and time consuming as the testing loops and procedures must converted to parallel operation and, in many cases, the vector timings hand adjusted to the chip design or DUT. Furthermore, in addition to having to generate a new test for each new chip design, designers must typically also re-generate the test for each new speed grade or "stepping" of the part produced, as the timings for the part will have changed, requiring the test timings and vectors to be re-adjusted by hand for the new part. This makes producing tests for new parts difficult and time consuming.

The software routines that operate computer-based devices, such as the integrated circuit testers and APGs of embodiments of the present invention, are often stored on a variety of machine-usable or computer-usable storage mediums. These software routines and drivers are often also referred to as firmware or ROM after the non-volatile ROM machine-usable storage device that such routines have historically been stored in. It is noted that such storage mediums can include, but are not limited to, a non-volatile Flash memory, a ROM, an EEPROM, a one time programmable (OTP) device, a complex programmable logic device (CPLD), an application specific integrated circuit (ASIC), a magnetic media disk, etc.

Algorithmic Pattern Generators take in APG command instructions (opcodes) and utilize registers, logical operations, Arithmetic Logic Units (ALUs), flow control and loops to perform the operations contained in the APG command instructions. Unlike processors, however, APGs are specialized to generate large test vectors and/or part commands for the device under test (DUT) (for example, 30+ bits of address, data, RAS, CAS, WE, CE, DQM for a memory device) and, as such, are typically designed to execute each command and output a result in a single APG clock cycle. The APG clock and APGs are also coupled to run synchronous with the DUT, and therefore, the APG clock is typically always equal to or a sub-multiple of the DUT clock, such as a quarter or a half speed. As stated above, due to their slow operation and slower clock speeds relative to the device under test, APGs are commonly coupled in parallel within the integrated circuit tester to generate the vectors for the DUT at the required rate. The tester then time-wise multiplexes the outputs of the APGs (typically utilizing the DUT clock) to convert the parallel outputs of the APGs to a sequential serial stream of vectors that is input to the DUT. In order to ease synchronization, in some integrated circuit testers, the APG clock domain, DUT clock domain, and number of APGs are related in a power of two ($2^N$) relationship (e.g., 1 DUT clock=¼ APG clock for use with 4 APGs, 1 DUT clock=½ APG clock for use with 2 APGs, or 1 DUT clock=1/X APG clock for use with X APGs, where X is $2^N$). However, it is noted that other integrated circuit testers which do not utilize a power of two number of APG's are also known, requiring the APG clock and DUT clock to not be synchronized in a power of two relation.

A problem with this arrangement is that one has to split up the APG command instructions for an interleaved execution in the parallel coupled APGs. In addition, it becomes difficult to execute a number of test opcodes that are not evenly divisible by, or a sub-multiple of, the number of ALGs being utilized by the tester (i.e., the number of test opcodes to be executed need to fall on a modulus boundary/the number of ALGs need to be a common denominator of the number of the test opcodes desired to be executed). In particular, it becomes difficult to execute a loop that has a non-modulus boundary number of test opcodes or iterations in the DUT clock domain (as noted above, each test opcode/APG command, be it an ALU instruction, set register, branch & call, call & return, etc. are designed to execute in a single APG clock cycle; extra clocks cannot be inserted). For example, an odd number of test opcodes or a loop that have an odd number of iterations in the DUT clock domain, when each APG clock is $2^N$ DUT clocks (for tester having a power of two ($2^N$) number of ALGs coupled in parallel). As a result designers are typically forced to look for ways to make their non-modulus boundary/non-evenly divisible number of APG command instructions or non-modulus boundary/non-evenly divisible number of iteration loops execute in an even modulus boundary/least common denominator between the number of APG command instructions/iterations and the number of APGs/DUT clocks per APG clock. This is typically found by "unwinding" or "unrolling" the loop to the next one or two multiples up and adjusting execution (e.g., 3 APG command instructions/iterations, 2 APGs=>2*3=6 instructions/iterations). It is noted that modulus boundary is utilized herein to refer to a number that can be evenly divided by a second number and leave no remainder. Specifically, the number of test opcodes/vectors of a section of test code need to be evenly divisible by the number of available APGs in the tester for it to be directly adapted for execution in parallel, if not the code must be unrolled/unwound to a number of opcodes that can be divided by the number of APGs if the number of APGs is used a common denominator.

Extending the number of APG command instructions or loop iterations is not too difficult of an issue when only dealing with two APGs or a single instance of instructions or loop iterations. However, when dealing with a more than a limited number of APGs and/or two or more nested loops/instructions this programming becomes quite complex. For example, in testing a memory array, where a separate nested loop may be established to iterate across each of the columns, the rows, and the banks of the array (e.g., 2 APGs, $1^{st}$ loop=3 APG instructions, $2^{nd}$ loop=1 APG instruction, $3^{rd}$ loop=1 APG instruction: $1^{st}$ loop=3=>2 APGs*3 instructions=6 instructions, $2^{nd}$ loop=1+$1^{st}$ loop=1+6=7=>2*7=14 instructions, $3^{rd}$ loop=1+$2^{nd}$ loop=1+14=15=>2*15=30 APG instructions). In addition, as mentioned above, this problem typically must be revisited when adapting the test to differing speed grades or "steppings" of the part, as typically only the timings of the part commands and test vector sequences will be changed for the new parts (assuming no fundamental design structural changes have occurred).

For example, the following idealized 6 vector-single loop AGP pseudo code as would be utilized with an ideal APG that could run as fast as an SDRAM memory device DUT it is testing:

---
Ideal Command Sequence loop 20
{
  ACTIVATE
  NOP, repeat 2
  PRECHARGE
  NOP, repeat 2
}
---

The same idealized 6 vector-single loop AGP pseudo code is unwound/unrolled in the following pseudo code example for use with four parallel coupled APGs that are time-wise multiplexed to provide the test vector sequences and DUT part commands (sub-instructions) in real time as fast as the SDRAM memory device DUT being testing requires them (each bracket [ ] enclosed sequence indicates a single APG "instruction" occurring during one APG clock, one sub-instruction in each of the 4 APGs):

---

4 sub-instruction command sequence utilizing 4 multiplexed APGs loop 10
{
　[ACTIVATE
　NOP
　NOP
　PRECHARGE]
　[NOP
　NOP
　ACTIVATE
　NOP]
　[NOP
　PRECHARGE
　NOP
　NOP]
}

---

Typically, to adjust the timings of the part commands and/or test vectors to adapt a test for use with the new part, all that is required is to insert or delete one or more APG "NOP" commands/opcodes into appropriate places in the AGP command sequence or the individual test vector command sequences (since the sequences of part commands are typically encoded in a specification and only the timing of the part commands and/or signals of the test vectors change with new speed grades). AGP NOP commands have the effect of maintaining the current AGP/tester output to the DUT for that DUT clock cycle. (Where a DUT clock is a fraction of an AGP clock. It is noted that, as referred to herein, for integrated circuit testers, an APG/tester "instruction" is the outputs of all the parallel coupled APGs that occurs in one APG clock cycle. An APG/tester "sub-instruction" is the output of a single APG for that APG clock cycle, which is then only multiplexed to the testers outputs to drive the device under test for a single DUT clock cycle within the APG clock period.) However, as stated above, this adjustment task becomes much more difficult when dealing with commands interleaved across multiple parallel APGs and within multiple nested loops, where inserting or deleting NOP commands can change the number of commands or iterations in the loops, requiring them to be adjusted and re-unwound to new even modulus boundaries to account for the new number of commands or iterations in each sub-loop (the lead denominator in each loop changes). A similar situation occurs when the manufacturer changes the number of APGs coupled in parallel in the tester. As can be seen, these changes are not trivial and are very prone to error, as each new version of the test must typically be hand configured to operate correctly.

As stated above, integrated circuit tester embodiments of the present invention utilize simplified methods of programming parallel coupled Algorithmic Pattern Generators (APGs) to generate test vectors and part commands with sub-instruction repeats. This enables simpler test programming and ease of test conversion to new part speed grades, steppings, or part designs. In one embodiment, a sub-instruction repeat is utilized to enable adjustment of the timing of an integrated circuit device under test (DUT) inputs, commands and test vectors so that the test can be adjusted for new part speed grades and/or steppings. In another embodiment, a sub-instruction repeats are utilized to enable adjustment of the timing of a memory device inputs, part commands and test vectors so that the test can be adjusted for new memory device speed grades.

FIG. 1 details a portion of an integrated circuit tester system 100 incorporating an integrated circuit tester 102 embodiment of the present invention having four APGs 108, 110, 112, 114 coupled in parallel through a multiplexer 106 to one or more integrated circuit devices under test (DUTs) 104. As detailed above, the four APGs 108, 110, 112, 114 each generate a test vector or part command (a sub-instruction) for each APG clock (an AGP instruction cycle) they receive. The multiplexer 106 then time-wise multiplexes the outputs of each of the four APGs 108, 110, 112, 114, coupling the output of a single AGP of the four APGs 108, 110, 112, 114 (a sub-instruction) to the inputs of the DUT 104 for each DUT clock. As also noted above, each AGP clock contains one or more DUT clocks. In embodiments of the present invention, each AGP clock contains the same number of DUT clocks, or more, as there are physical APGs 108, 110, 112, 114 utilized in the integrated circuit tester 102.

It is noted that other embodiments of the present invention, the integrated circuit tester 102 can test multiple DUTs 104 in parallel utilizing the same vectors generated the AGPs 108, 110, 112, 114 that are input to each DUT 104 in parallel while separately collecting and analyzing the outputs of the separate DUTs 104. It is also noted that other integrated circuit testers 102 and integrated circuit testing system 100 embodiments of the present invention are possible, such as, but not limited to integrated testers 102 incorporating one, two, three, four or more APGs 108 and multiplexing, and, as such, will be apparent to one skilled in the art with the benefit of the present disclosure.

As stated above, each tester "instruction" contains the outputs of each APG for that APG clock cycle. The output of a single APG of the tester during an APG clock cycle is called a "sub-instruction" and is only sampled once by prior art testers through being multiplexed to output to the DUT in a DUT clock cycle of a current APG clock cycle period. Because of this and the parallel utilization of multiplexed APGs (typically an even/power-of-two number of APGs) to generate the test vector sequences and part commands in real-time, test programming (in particular, nested loops and non-modulus boundary/non-evenly divisible numbers of test commands/instructions) and test reuse has become a non-trivial task.

Embodiments of the present invention utilize sub-instruction repeats to simplify test programming by reducing the complexity of programming nested loops and non-modulus boundary/non-evenly divisible numbers of test instructions/commands (such as an odd number of commands in a loop executing on 2^N APGs). In addition, reuse of test code between new designs, speed grade changes and/or new integrated circuit die steppings are promoted.

Repeating sub-instruction involves pausing or dwelling on the output of a single APG of the integrated circuit tester for two or more DUT clocks, allowing the output of that APG to be maintained on input to the DUT(s) for the selected number of DUT clocks. As many of the APG instructions involve repeating the same test vector sequence outputs/part commands over multiple DUT clocks, this eliminates much of the need to hard code these repeated test code instructions into the APG command sequence. This counter-intuitive slowing of the APGs and their outputs through sub-instruction repeats reduces the requirement to unwind or unroll the test code when multiplexing the test across multiple parallel APGs in an integrated circuit tester and has the effect of virtually extending the parallel APG array up to the equivalent of the total number of sub-instruction repeats allowed in an APG clock/APG instruction. In addition, utilizing sub-instruction repeats also improves reuse of test code programming in general in that many of the necessary test code adjustments are reduced to adding or subtracting sub-instruction repeats from the code to speed up or slow down test vector/part command outputs. In particular, NOP commands (where the APGs maintain the last test vector sequence or part command being input to the DUT) are in many cases repeated two or more times in a given test command/opcode sequence. In addition, NOP commands are often what is required to be adjusted when adapting the test code for a new speed grade part. Sub-instruction repeats therefore help solve the least common multiple problem for non-modulus boundary/non-evenly divisible loops and test code instructions.

For example, the same idealized 6 vector-single loop AGP pseudo code for a SDRAM memory device from above would result in the following pseudo code example utilizing sub-instruction repeats for use with four parallel coupled APGs that are time-wise multiplexed with sub-instruction repeats:

4 Sub-Instruction Command Sequence with Phase Level/Sub-Instruction Repeats Utilizing 4 Multiplexed APGs
[ACTIVATE
NOP, repeat 2
PRECHARGE
NOP, repeat 2], repeat 20

It is noted that in this, and in other simplified pseudo code routines, sub-instruction repeats allow for a return to nearly the idealized code form. It is also noted that sub-instruction repeats can have the effect of making the APG clock period variable, in that each APG clock can now include the same number or more, depending on the number of sub-instruction repeats, of DUT clocks/sub-instructions as there are physical APGs present in the integrated circuit tester. It is further noted that in this example, in both the 4 sub-instruction command sequence with sub-instruction repeats and in the idealized command/vector sequence, adjusting the command sequence for a new speed grade of part requires only adjusting the number of repeats in the sequence.

It is also noted that not all possible sub-instruction repeats in a given APG command sequence or test vector sequence need be utilized during programming, allowing the number of sub-instructions actually being executed by an APG (instead of simply repeated) to be adjusted to match the total number of APGs coupled in parallel for use in the integrated circuit tester, this allows the designer to adjust code sequences and loops to closely match the modulus boundaries imposed by the parallel execution of the APGs.

In one embodiment of the present invention sub-instruction repeats can be implemented through control of the APG master sequencer (or APG instruction pointers) and APG output multiplexer. In another embodiment of the present invention sub-instruction repeats can be implemented through masking/stalling of the APG clock and DUT clock (for example, by control of clock enable (CE) of the multiplexer and APGs) to implement sub-instruction repeats in the APGs and APG output multiplexer. It is noted that other methods of multiplexing APGs with sub-instruction repeats utilizing embodiments of the present invention are possible and will be apparent to those skill in the art with the benefit of the present disclosure.

Figure 2:
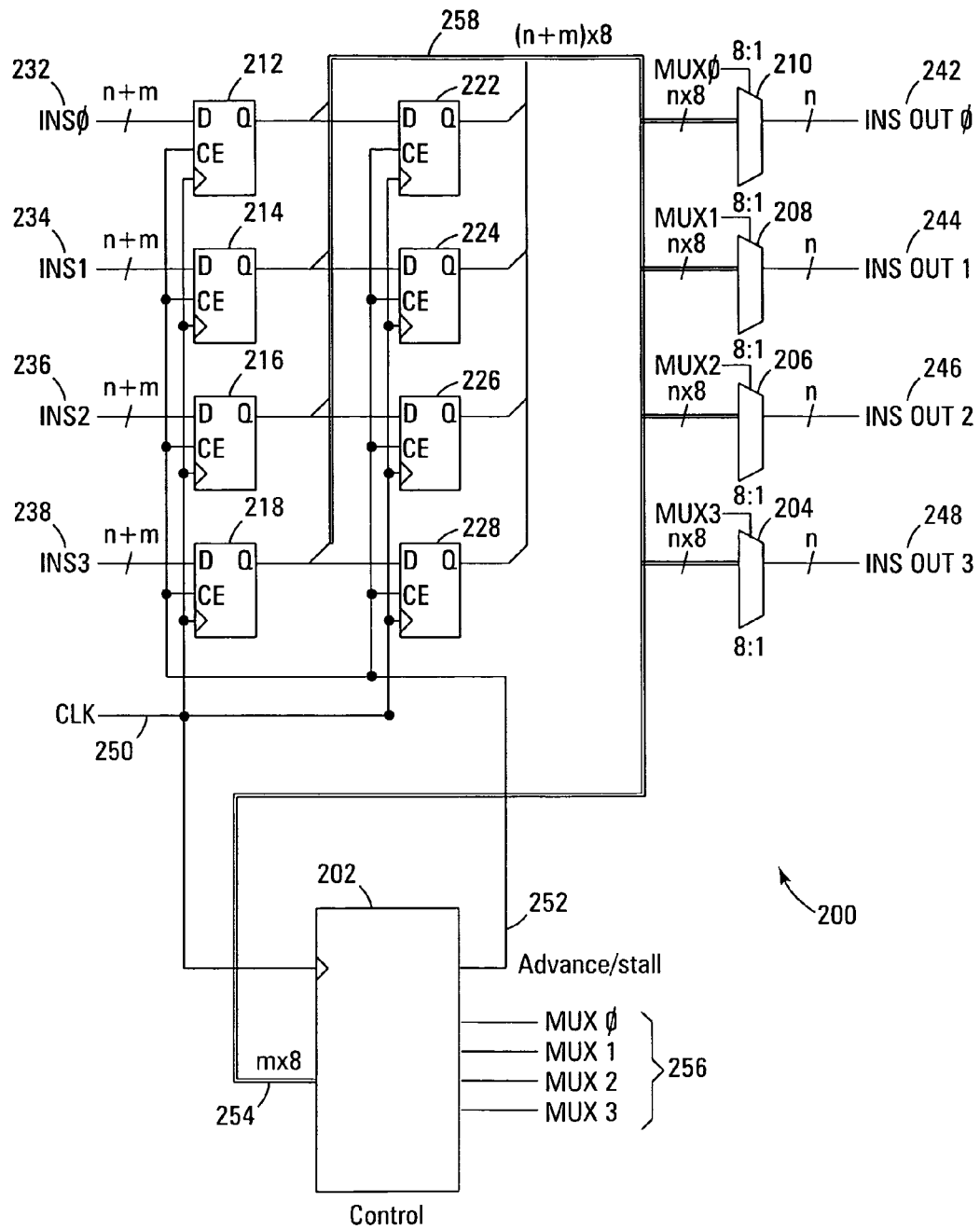
FIG. 2 is a simplified block diagram of a multiplexer circuit and controller in accordance with an embodiment of the present invention.

FIG. 2 details a multiplexer and control circuit 200 of one embodiment of the present invention that allow for sub-instruction repeats of APG commands/outputs. In FIG. 2, the multiplexer and control circuit 200 accepts test vector sequence inputs 232, 234, 236, 238 from four APGs and then outputs 242, 244, 246, 248 the test vector sequences to one or more coupled DUTs through multiplexers 204, 206, 208, 210. The test vector inputs 232, 234, 236, 238 are each n+m bits long and include n instruction bits (a n-bit test vector command) and a m-bit repeat count. In the multiplexer and control circuit 200, each n+m bit test vector input 232, 234, 236, 238 is clocked into registers 212, 214, 216, 218 and 222, 224, 226, 228 that are arranged two rows deep (first register row 212, 214, 216, 218 and second register row 222, 224, 226, 228) to enable storage of 2 APG clocks/2 APG instructions of test vector input data and repeat counts for ease of integrated circuit tester synchronization and operation. The registers 212, 214, 216, 218 and 222, 224, 226, 228 are coupled to the multiplexers 204, 206, 208, 210 and the controller 202 by a (n+m)*8 data bus 258. The multiplexers 204, 206, 208, 210 are controlled by controller 202, which selects the next sequential n-bit test vector from the data bus 258 to output to the coupled DUT(s). Upon selecting the next test vector to output to the DUT(s), the controller 202 reads the associated m-bit repeat count (allowing up to $2^m$ possible repeats of the instant APG sub-instruction output) and maintaining the selected test vector that number of DUT clocks, dwelling on the test vector sequence output and maintaining its input to the DUT(s). In addition, the controller 202 outputs an Advance/Stall* signal 252 to the clock enable inputs of the registers 212, 214, 216, 218 and 222, 224, 226, 228, allowing the APG clock signal 250 to be delayed/stalled and maintaining the register contents.

As stated above, one form of integrated circuits are data storage devices, known as memory devices, which are typically utilized as internal storage areas in computers and computer based devices. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Memory comes in multiple forms and interfaces, but is conventionally internally formatted in an array of rows and columns. Memory devices are typically accessed by the input of a command and an address, typically in a row and column format, followed by the data to be written to the memory (for a write access) or by the presentation at the data output of the memory of the read data (for a read access). Common RAM memory types include both Static RAM (SRAM) and Dynamic RAM (DRAM). Static RAM memory retains its data contents as long as power is available, and due to its speed is typically utilized in cache memory systems and buffers where speed of operation is important. However, due to the relatively inefficient array size and power consumption of Static RAM, most computer systems also utilize Dynamic RAM, which are slower to access, but utilize a more size efficient array due to their keeping individual bits of data in a charge stored in small capacitor based memory cells. Unfortunately, these data charges slowly discharge over time, even with the DRAM being continuously powered, and thus must be periodically restored by a "refresh" operation. Many common DRAM memory types and interfaces include, but are not limited to, Extended Data Out DRAM (EDO DRAM), synchronous DRAM (SDRAM), double data rate SDRAM (DDR-SDRAM), double data rate 2 SDRAM (DDR2-SDRAM), quad data rate SDRAM (QDR-SDRAM), and Rambus DRAM (RDRAM).

As previously stated, computers almost always contain a small amount of read-only memory (ROM) that holds instructions for starting up the computer. Memory devices that do not lose the data content of their memory cells when power is removed are generally referred to as non-volatile memories. EEPROM (electrically erasable programmable read-only memory) is a special type of non-volatile ROM that can be erased by exposing their cells to an electrical charge. EEPROM comprise a large number of memory cells having electrically isolated gates (floating gates). Data is stored in the floating gate field effect transistor (FET) memory cells in the form of charge on the floating gates. The floating gate is typically made of doped polysilicon, or non-conductive charge trapping layer (a floating node), such as nitride, is disposed over the channel region and is electrically isolated from the other cell elements by a dielectric material, typically an oxide. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of floating gate memory cells. Unlike EEPROM, the cells of a Flash memory are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent non-volatile memory devices multiple bits have been stored in a single cell by utilizing multiple threshold levels (multi-level cells or MLC) or a non-conductive charge trapping layer with the storing of data trapped in a charge near each of the sources/drains of the memory cell FET. Synchronous Flash memory devices which are compatible with synchronous DRAM memory interfaces (such as the SyncFlash® memory devices of Micron Technology, Inc.) are also known.

A NAND architecture array of a EEPROM or Flash also arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity. It is noted that other non-volatile memory array architectures exist, including, but not limited to AND arrays, OR arrays, and virtual ground arrays.

Figure 3:
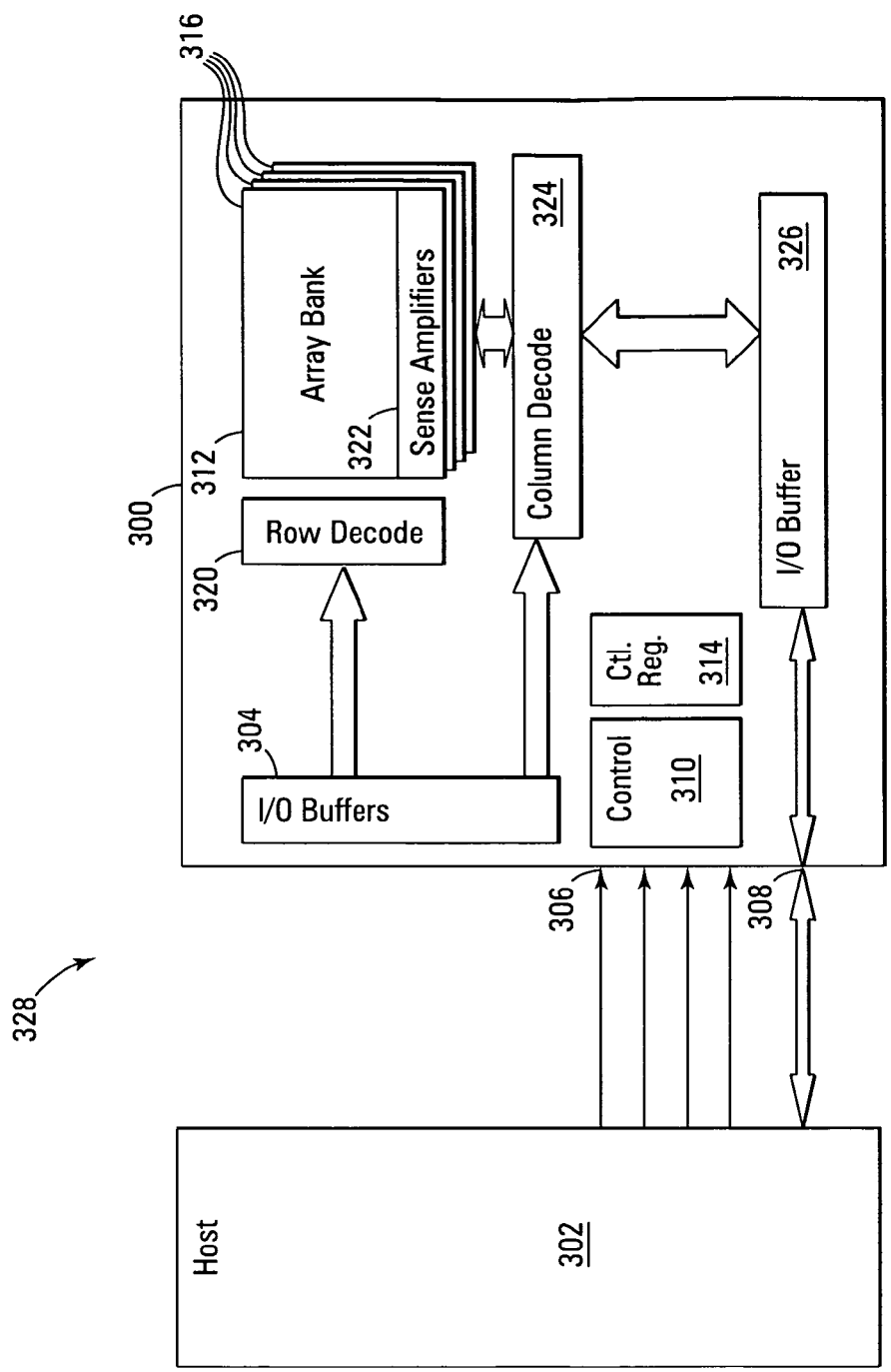
FIG. 3 is a simplified block diagram of a system containing a memory device.

FIG. 3 details a simplified diagram of a system 328 incorporating a memory device 300 of an embodiment of the present invention connected to a host 302, which is typically a processing device or memory controller during utilization. It is noted that an integrated circuit tester typically takes the place of the host 302 during testing. The memory 300, such as a DRAM or Flash memory device, has a control interface 306 and an address/data interface 308 that are each connected to the processing device 302 to allow memory read and write accesses. It is noted that in other embodiments, the address/data interface 308 can be divided into separate interfaces. Internal to the memory device a control state machine/control circuit 310 directs the internal operation; managing the memory array 312 and updating RAM control registers 314. The RAM control registers and tables 314 are utilized by the control state machine 310 during operation of the memory 300. The memory array 312 contains a sequence of memory banks or segments 316. Memory access addresses are received on the address/data interface 308 of the memory 300 and divided into a row and column address portions. On a read access, the row address is latched by the interface I/O buffer 304 and decoded by row decode circuit 320, which selects and activates a row page (not shown) of memory cells across a selected memory bank. The bit values encoded in the output of the selected row of memory cells are connected from a local bit line/string (not shown) to a bit line (not shown) and detected by sense amplifiers 322 associated with the memory bank. The sense amplifiers 322 also typically include a data cache and write data latch circuits (not shown). The column address of the access is also latched by the interface I/O buffer 304 and decoded by the column decode circuit 324. The output of the column decode circuit selects the desired column data from the sense amplifier outputs and connected to the data buffer 326 for transfer from the memory device through the address/data interface 308. It is noted that in one embodiment of the present invention, the column decode 324 may be optionally placed between the memory array 312 and the sense amplifiers 322. On a write access the row decode circuit 320 selects the row page and column decode circuit selects write sense amplifiers 322. Data values to be written are connected from the data buffer 326 to the data cache and then to the write data latches of the write sense amplifiers 322 selected by the column decode circuit 324 and written to the selected memory cells (not shown) of the memory array 312. The written cells may then be optionally reselected by the row and column decode circuits 320, 324 and sense amplifiers 322 so that they can be read to verify that the correct values have been programmed into the selected memory cells.

It is noted that other integrated circuit testers, methods, multiplexer circuits and sub-instruction repeat embodiments of the present invention are possible and will be apparent for those skilled in the art with the benefit of this disclosure.

CONCLUSION

An integrated circuit tester and multiplexer circuit has been described that utilizes methods of programming parallel coupled Algorithmic Pattern Generators (APGs) in embodiments of the present invention to generate test vector sequences and part commands with sub-instruction repeats. This enables simpler test programming and ease of test conversion to new part speed grades, steppings, or part designs. In one embodiment, a sub-instruction repeat is utilized to enable adjustment of the timing of test vector sequences and part commands sent to an integrated circuit device under test (DUT) so that the test can be adjusted for new part speed grades and/or steppings. In another embodiment, a sub-instruction repeats are utilized to enable adjustment of the timing of a memory device inputs, memory commands and test vector sequences so that the test can be adjusted for new memory device speed grades.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating an integrated circuit tester, comprising:
executing a command sequence of a test on an integrated circuit tester containing two or more Algorithmic Pattern Generators (APGs) by executing the test command sequence in parallel on the two or more APGs, wherein each APG of the two or more APGs generates a single sub-instruction of a test instruction during each APG clock cycle;
coupling the outputs of the two or more APGs to one or more integrated circuit devices under test (DUTs), wherein only one sub-instruction is coupled to the one or more DUTs during a DUT clock cycle and where each APG clock cycle contains two or more DUT clock cycles; and
repeating a selected sub-instruction of a single APG by coupling the selected sub-instruction of that single APG to the one or more DUTs over two or more consecutive DUT clock cycles.

2. The method of claim 1, further comprising selecting the DUT to comprise a memory device.

3. The method of claim 1, further comprising selecting the two or more APGs to comprise 2^N APGs.

4. The method of claim 1, wherein repeating a selected sub-instruction by coupling the selected sub-instruction to the one or more DUTs on two or more consecutive DUT clock cycles further comprises coupling the selected sub-instruction generated by a selected APG to one or more DUTs through a multiplexer circuit.

5. The method of claim 1, wherein repeating a selected sub-instruction by coupling the selected sub-instruction to the one or more DUTs over two or more consecutive DUT clock cycles further comprises repeating a selected sub-instruction by coupling the selected sub-instruction to the one or more DUTs over a number of consecutive DUT clock cycles, where the number of consecutive DUT clock cycles is selected by a repeat count associated with the selected sub-instruction.

6. The method of claim 1, further comprising adjusting one or more sub-instruction repeats of the command sequence to adjust the command sequence of the test for a new speed grade or stepping of the integrated circuit DUT.

7. The method of claim 1, further comprising adjusting one or more sub-instruction repeats of one or more loops of the test to adjust the command sequence of those one or more loops of the test.

8. The method of claim 1, further comprising adjusting one or more sub-instruction repeats of one or more sub-sequences of the command sequence of the test to match the one or more sub-sequences to the APG instruction modulus boundaries.

9. A method of programming Algorithmic Pattern Generators (APGs), comprising:
executing a command sequence in parallel on two or more Algorithmic Pattern Generators (APGs), wherein each APG generates an output from the command sequence for each clock cycle of a first clock;
multiplexing the two or more APGs during each clock cycle of the first clock to provide a sequential output, wherein a single APG output is selected for each clock cycle of a second clock, and where each clock cycle of the first clock contains two or more clock cycles of the second clock; and
selectively repeating a selected APG output of a single APG of the two or more APGs across two or more consecutive clock cycles of the second clock.

10. The method of claim 9, further comprising selecting the first clock cycle to comprise a variable clock cycle period.

11. The method of claim 9, further comprising selecting the number of two or more consecutive clock cycles of the second clock that comprise a cycle of the first clock to be variable.

12. The method of claim 9, wherein the selected APG output of a single APG is repeated across a number of consecutive clock cycles of the second clock that is equal to a repeat count associated with the selected APG output.

13. The method of claim 9, further comprising selecting the DUT to comprise one of a Static RAM (SRAM), a Dynamic RAM (DRAM), and a non-volatile memory device.

14. The method of claim 9, further comprising adjusting the command sequence for a new speed grade or stepping of an integrated circuit by adjusting one or more APG output repeats of the command sequence.

15. The method of claim 9, further comprising adjusting the command sequence of one or more loops of the command sequence by adjusting one or more APG output repeats of the command sequence.

16. A method of testing an integrated circuit, comprising:
coupling an integrated circuit to a tester having two or more Algorithmic Pattern Generators (APGs) as a device under test (DUT);
executing a test in parallel on two or more Algorithmic Pattern Generators (APGs), wherein each APG generates a different sub-instruction during each APG system clock cycle;
multiplexing the two or more APGs to provide a sequence of two or more sub-instructions for each APG system clock cycle to the integrated circuit, wherein a single APG sub-instruction output of a single APG is coupled to the integrated circuit for each DUT clock cycle, where each APG clock cycle contains two or more DUT clock cycles; and
maintaining multiplexing of a selected APG for two or more consecutive DUT clock cycles to couple its sub-instruction output to the integrated circuit for two or more consecutive DUT clock cycles.

17. The method of claim 16, further comprising selecting the integrated circuit to comprise one of a Static RAM (SRAM), a Dynamic RAM (DRAM), a EEPROM and a Flash memory device.

18. The method of claim 16, further comprising adjusting one or more APG sub-instruction repeats of the test to adjust the test for a new speed grade or stepping of the integrated circuit.

19. The method of claim 16, further comprising adjusting one or more APG sub-instruction repeats of one or more loops of the test to adjust the command sequence of those one or more loops of the test.

20. The method of claim 16, further comprising adjusting the clock period of the APG clock depending on the number of APG sub-instruction repeats in an APG instruction being executed in parallel.

21. A non-transitory machine-usable medium, the machine-usable medium storing a software routine for causing a processor to execute a method, wherein the method comprises:
executing a command sequence of a test on two or more Algorithmic Pattern Generators (APGs), wherein the two or more APGs are coupled in parallel with multiplexed outputs, where the two or more APGs provide device inputs and commands of an instruction during each APG clock cycle to one or more integrated circuit devices under test (DUTs), where each APG of the two or more APGs generates a single sub-instruction of the instruction during each APG clock cycle, and where only one sub-instruction is coupled to one or more DUTs during a DUT clock cycle; and repeating a selected sub-instruction of a single APG by coupling the selected sub-instruction of that single APG to the one or more DUTs on two or more consecutive DUT clock cycles.

22. The non-transitory machine-usable medium of claim 21, wherein the method further comprises adjusting the test for a new speed grade or stepping of the integrated circuit by adjusting one or more sub-instruction repeats of the test.

23. The non-transitory machine-usable medium of claim 21, wherein the method further comprises adjusting one or more loops of the test by adjusting one or more sub-instruction repeats.

24. An integrated circuit tester, comprising:
two or more Algorithmic Pattern Generators (APGs), wherein the two or more APGs are adapted to execute the command sequences of a test in parallel; and
a multiplexer circuit coupled to the two or more APGs, wherein the multiplexer circuit is adapted to couple an output of a selected APG to an integrated circuit device under test (DUT) over two or more consecutive clock periods of a clock coupled to the DUT.

25. The integrated circuit tester of claim 24, wherein the multiplexer circuit is further adapted to sequentially couple an output of a selected APG of the two or more APGs to the DUT on each DUT clock period.

26. The integrated circuit tester of claim 24, wherein the DUT is a memory device.

27. The integrated circuit tester of claim 24, wherein the multiplexer circuit further comprises:
a controller; and
one or more output multiplexers, wherein the one or more output multiplexers are coupled to the two or more APGs.

28. The integrated circuit tester of claim 27, wherein the multiplexer circuit further comprises one or more registers, wherein the one or more registers are coupled to the controller and adapted to hold two or more APG sub-instruction inputs.

29. The integrated circuit tester of claim 28, wherein the controller further comprises a clock enable signal coupled to the two or more registers.

30. The integrated circuit tester of claim 27, wherein the controller further comprises a clock enable signal coupled to the two or more APGs.

31. The integrated circuit tester of claim 27, wherein the controller is adapted to receive a repeat count with a selected APG output, where the repeat count indicates the number of DUT clocks to couple the selected APG output to the DUT.

32. An integrated circuit tester system, comprising:
an integrated circuit tester coupled to one or more devices under test (DUTs), wherein the integrated circuit tester comprises,
two or more Algorithmic Pattern Generators (APGs), and
a multiplexer circuit coupled to the two or more APGs,
wherein the integrated circuit tester system is adapted to execute a test command sequence on the two or more APGs and couple a single APG sub-instruction output from an APG to the one or more DUTs for each DUT clock cycle, where each APG clock cycle contains two or more DUT clock cycles; and
wherein the integrated circuit tester system is further adapted to maintain a selected APG sub-instruction output of a single APG for two or more consecutive DUT clock cycles.

33. The integrated circuit tester system of claim 32, wherein the integrated circuit tester system is adapted to sequentially couple an output of a selected APG of the two or more APGs to the one or more DUTs on each DUT clock cycle.

34. The integrated circuit tester system of claim 32, wherein the DUT is one of a Static RAM (SRAM), a Dynamic RAM (DRAM), and a non-volatile memory device.

35. The integrated circuit tester system of claim 32, wherein the multiplexer circuit further comprises:
a controller; and
one or more output multiplexers, wherein the one or more output multiplexers are coupled to the two or more APGs.

36. The integrated circuit tester system of claim 35, wherein the controller further comprises a clock enable signal coupled to the two or more APGs and where the integrated circuit tester system is adapted to stall the APG clock signal a number DUT clock cycles equal to a total number of APG sub-instruction repeats in a current APG instruction.

37. The integrated circuit tester system of claim 35, wherein the controller is adapted to receive a repeat count with a selected APG sub-instruction, where the repeat count indicates the number of DUT clocks to maintain the selected APG sub-instruction output.

38. A integrated circuit tester output multiplexer circuit, comprising:
two or more Algorithmic Pattern Generators (APGs) sub-instruction inputs;
one or more multiplexers coupled to two or more sub-instruction outputs and the two or more sub-instruction inputs; and
a controller coupled to the one or more multiplexers, wherein the controller is adapted to maintain a selected APG sub-instruction input of a single APG coupled to the two or more sub-instruction outputs through the one or more multiplexers for two or more consecutive clock cycles.

39. The integrated circuit tester output multiplexer circuit of claim 38, further comprising one or more registers, wherein the one or more registers are adapted to hold two or more APG sub-instruction inputs.

40. The integrated circuit tester output multiplexer circuit of claim 38, further comprising a APG master sequencer delay control.

41. The integrated circuit tester output multiplexer circuit of claim 38, further comprising an APG clock enable signal or an Advance/Stall* clock enable signal.

42. The integrated circuit tester output multiplexer circuit of claim 38, wherein the controller is adapted to receive a repeat count.

* * * * *